United States Patent [19]
Patel et al.

[11] Patent Number: 6,020,758
[45] Date of Patent: Feb. 1, 2000

[54] PARTIALLY RECONFIGURABLE PROGRAMMABLE LOGIC DEVICE

[75] Inventors: Rakesh H. Patel, Cupertino; Kevin A. Norman, Belmont, both of Calif.

[73] Assignee: Altera Corporation, San Jose, Calif.

[21] Appl. No.: 08/615,341

[22] Filed: Mar. 11, 1996

[51] Int. Cl.[7] ............................ H03K 19/173; H03K 7/38
[52] U.S. Cl. ............................................. 326/40; 326/38
[58] Field of Search ........................................ 326/38, 40

[56] References Cited

U.S. PATENT DOCUMENTS

| | | | |
|---|---|---|---|
| 5,426,378 | 6/1995 | Ong | 326/39 |
| 5,572,707 | 11/1996 | Rozman et al. | 395/497.01 |
| 5,592,105 | 1/1997 | Cheung et al. | 326/38 |
| 5,646,544 | 7/1997 | Iadanza | 326/38 |
| 5,721,498 | 2/1998 | Mason et al. | 326/38 |
| 5,760,602 | 6/1998 | Tan | 326/38 |
| 5,760,603 | 6/1998 | Zhou | 326/40 |
| 5,781,756 | 7/1998 | Hung | 395/430 |

FOREIGN PATENT DOCUMENTS

| | | | |
|---|---|---|---|
| 0 435 093 | 7/1991 | European Pat. Off. | H01L 23/498 |
| 0 438 127 | 7/1991 | European Pat. Off. | H01L 21/66 |
| 0 564 865 | 10/1993 | European Pat. Off. | H01L 21/66 |

OTHER PUBLICATIONS

"Semiconductor Chip I/O Configuration for Plastic Flat Pack, Tape Automated Bonding, or Solder Ball–Joined Flip Chip Packages," *IBM Technical Disclosure Bulletin*, vol. 33, No. 10B, Mar. 1, 1991, pp. 332/333 XP00011022.

*Primary Examiner*—Michael J. Tokar
*Assistant Examiner*—Richard Roseen
*Attorney, Agent, or Firm*—Townsend and Townsend and Crew LLP

[57] ABSTRACT

Various embodiments of a programmable logic device (PLD) capable of being dynamically partially reconfigured are disclosed. The PLD provides circuitry for changing its configuration data in whole or in part without halting the operation nor losing any of the logic state of the PLD. In one embodiment, data injection circuitry are added to a FIFO architecture to allow the user to inject data at random locations without disturbing the functionality of the PLD. In another embodiment, the PLD architecture is designed to provide for address wide or frame wide accessing of configuration bits. This allows for address wide configuration and reconfiguration.

7 Claims, 4 Drawing Sheets

PARTIALLY RECONFIGURABLE PROGRAMMABLE LOGIC DEVICE

RELATED APPLICATIONS

The present invention is related to commonly assigned, co-pending U.S. patent application Ser. No. 08/615,342, entitled "Sample and Load Scheme for Observability of Internal Nodes in a PLD," by Patel et al., which is hereby incorporated by reference in its entirety.

BACKGROUND OF THE INVENTION

The present invention relates in general to programmable logic devices (PLDs), and in particular to a PLD that can be dynamically partially reconfigured without disturbing previous configuration.

Programmable logic devices are digital, user-configurable integrated circuits that can implement complex custom logic functions. For the purposes of this description, the term PLD encompasses all digital logic circuits configured by the end user, including programmable logic arrays (PLAs), field programmable gate arrays (FPGAs), erasable and complex PLDs and the like. Such devices are sometimes referred to as, for example, PALs, FPLAs, EPLDs, EEPLDs, LCA, and CPLDs. The basic building block of a PLD is a logic element, sometimes referred to as a macro cell. Typically, a logic element contains combinatorial logic as well as a programmable flipflop to implement sequential logic.

One approach to implementing a logic element utilizes a programmable memory structure that includes memory cells for storing information corresponding to a desired logic configuration. The memory structure is then connected to a look-up table that, based on a logical combination of its several inputs, produces a selected bit from the memory structure at an output. To be able to perform sequential logic, the output of the look-up table also feeds an input of a configurable register.

The programming element in such a logic element can be implemented in a variety of technologies: fusible links, mask or electrically programmable read-only memory cells, or static random access memory (SRAM) cells. The complexity of the required programming circuitry varies with the type of memory technology used. For example, in the case of a PLD that uses SRAM technology as the logic configuration host, address decoding logic is required to load the programming data into the memory cells.

To program the PLDs, configuration data is usually loaded into the device upon power up. Existing PLDs commonly provide for a large shift register that is loaded with configuration data upon power up. The configuration data is then shifted into its destination configuration bits in a first-in first-out (FIFO) fashion. For example, to program a block or sub-group of SRAM based logic elements in a PLD, there may be multiple address lines provided to access various bits, but only one data line that travels through a string of SRAM cells. Thus, data must travel through the entire array of SRAM bits to fully program the PLD.

In most applications, before entering the user mode, the PLD is generally required to go through only one full cycle of programming. Configuration data is therefore loaded into the PLD once and there is usually no need to subsequently change the state of randomly located configuration bits. The FIFO approach in programming the SRAM based PLD thus works efficiently for most applications. This approach, however, suffers from drawbacks in those applications that require partial reconfiguration. Because data must travel through the entire array, for all practical purposes, FIFO programming does not allow the PLD to be partially reconfigured. That is, to reconfigure or change the state of one or several configuration bits in the middle of the SRAM array, the entire array must be reconfigured. This type of reconfiguration stops the programmed logic flow as well and thus cannot be performed without disturbing the PLD logic functionality.

A fast growing field of application for PLDs has been emulation and prototyping systems. Emulation systems help in debugging complex designs with quick turn-around which ensure successful time-to-market for the final product. PLDs are particularly suited for such debug systems since they provide the flexibility required by design adjustments resulting from design errors or enhancements. Often, the emulation system manufacturers are interested not only in the proper system design, but also in the near proper operation of the system when one or a small number of faults are present in the design. In testing for proper system operation, a useful feature for production quality testing is the ability to insert a fault. Test vectors are then run to see if the fault is detected. Failure to detect the fault indicates that the test program needs further refinements. Other systems are required to be fault tolerant. For these systems, it is desirable to insert a fault and observe that the system takes the designed fault recovery steps and continues to operate.

In both of the above cases, it is highly desirable to be able to change only a small part of the design while retaining the bulk of the configuration intact. For example, fault grading a set of production test vectors requires a large number of system reconfigurations in order to inject faults. Such a fault grading of a system using conventional PLDs where the entire PLD would have to be reconfigured each time, would be prohibitively time consuming.

A further requirement of testing fault tolerant systems is "crisp" fault injection while the system is still running at full speed. Crisp fault injection refers to changing the state of a configuration bit all at once without intermediate configurations being altered between the initial and destination configurations. Only when the fault can be crisply introduced into a running system can the complete fault recovery behavior be observed dynamically (i.e., on-the-fly).

From the foregoing it can be appreciated that the conventional FIFO approach to PLD configuration fails to adequately meet the requirements of many new applications. It is therefore desirable to provide a PLD programming technique that allows for static or dynamic partial reconfigurability without disturbing design functionality.

SUMMARY OF THE INVENTION

The present invention provides methods and circuitry for a PLD that is dynamically partially reconfigurable. In one embodiment, data injection circuitry is added to a PLD with FIFO programming architecture. The data injection circuitry enables the user to inject data into selected portions of the configuration host without disturbing the functionality of the PLD. In another embodiment, the present invention provides a PLD that instead of a FIFO programming architecture, uses an address wide programming technique that allows for dynamic partial reconfiguration.

A better understanding of the nature and advantages of the PLD of the present invention may be had with reference to the detailed description and the diagrams below.

DESCRIPTION OF SPECIFIC EMBODIMENTS

Figure 1:
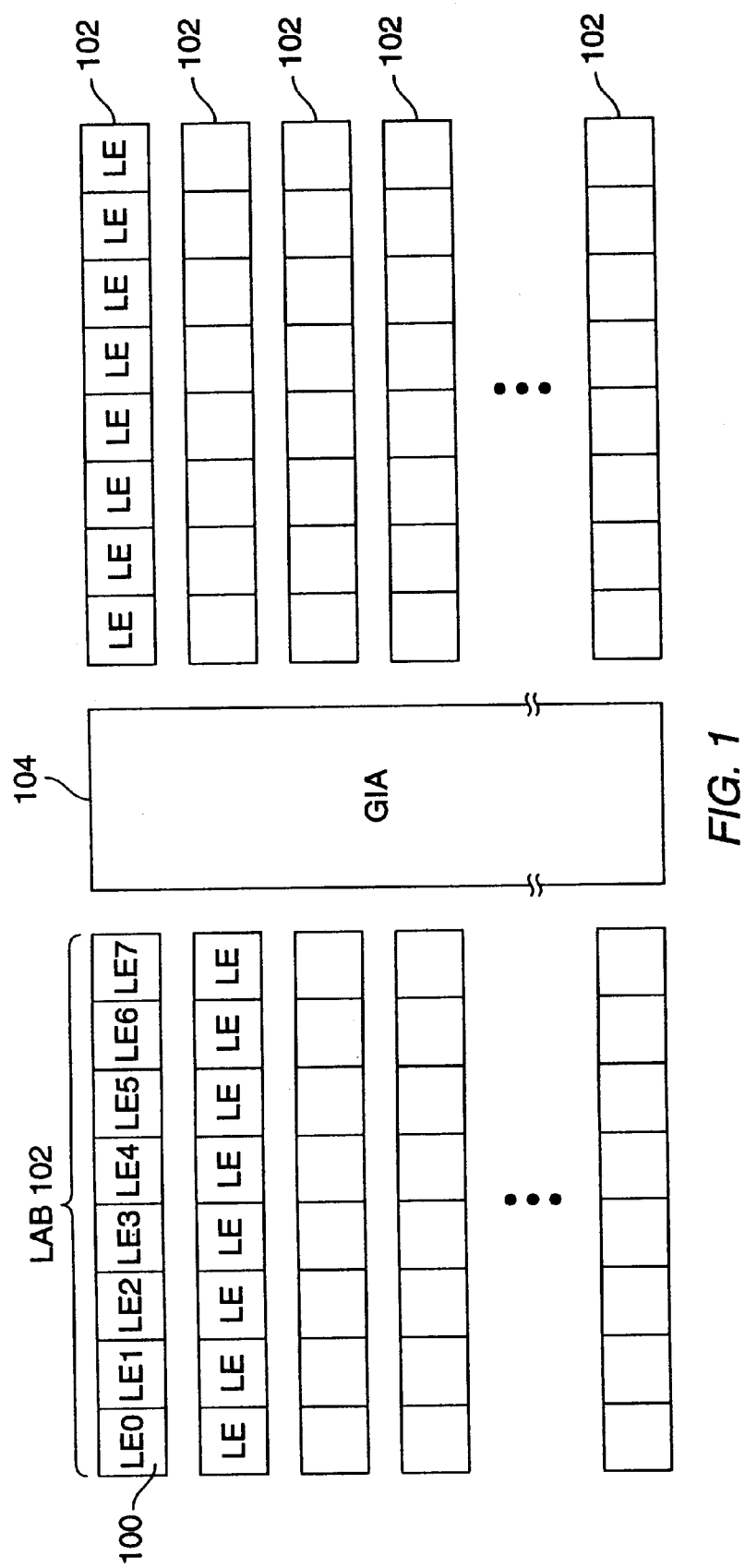
FIG. 1 is a simplified block diagram of an exemplary PLD.

Referring to FIG. 1, there is shown a simplified block diagram of an exemplary PLD. A number of (e.g., 8) logic elements 100 are grouped together in a row to form a logic array block or LAB 102. Multiple LABs 102 are stacked in two or more columns and are connected together by a programmable global interconnect array GIA 104. GIA 104 employs a very fast multiplexer-based interconnect network to carry all signals that must span across LAB boundaries, as well as all input signals into the device.

Figure 2:
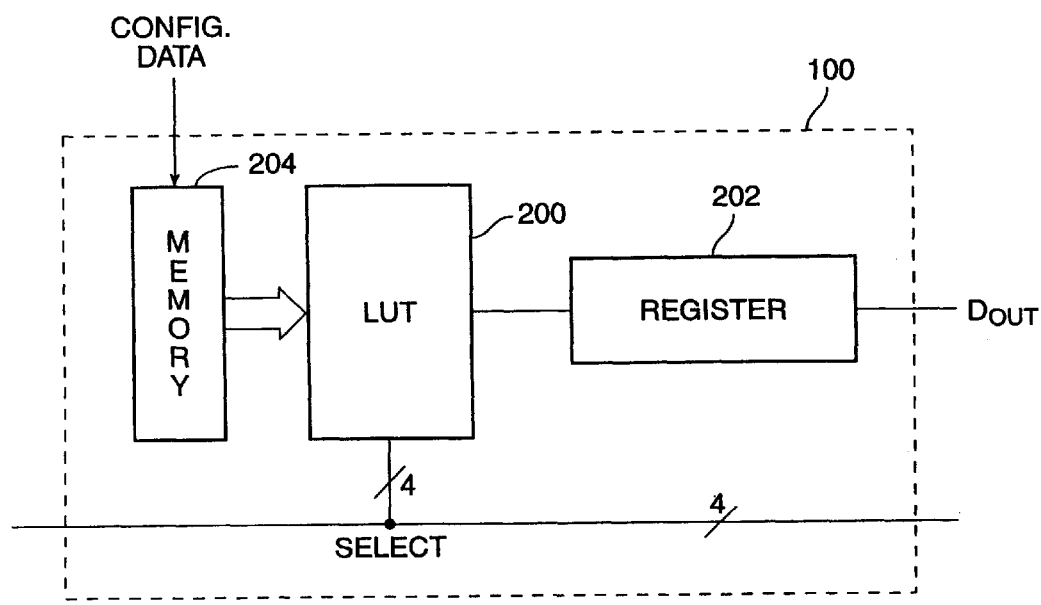
FIG. 2 is a simplified block diagram of a logic element.
Figure 3:
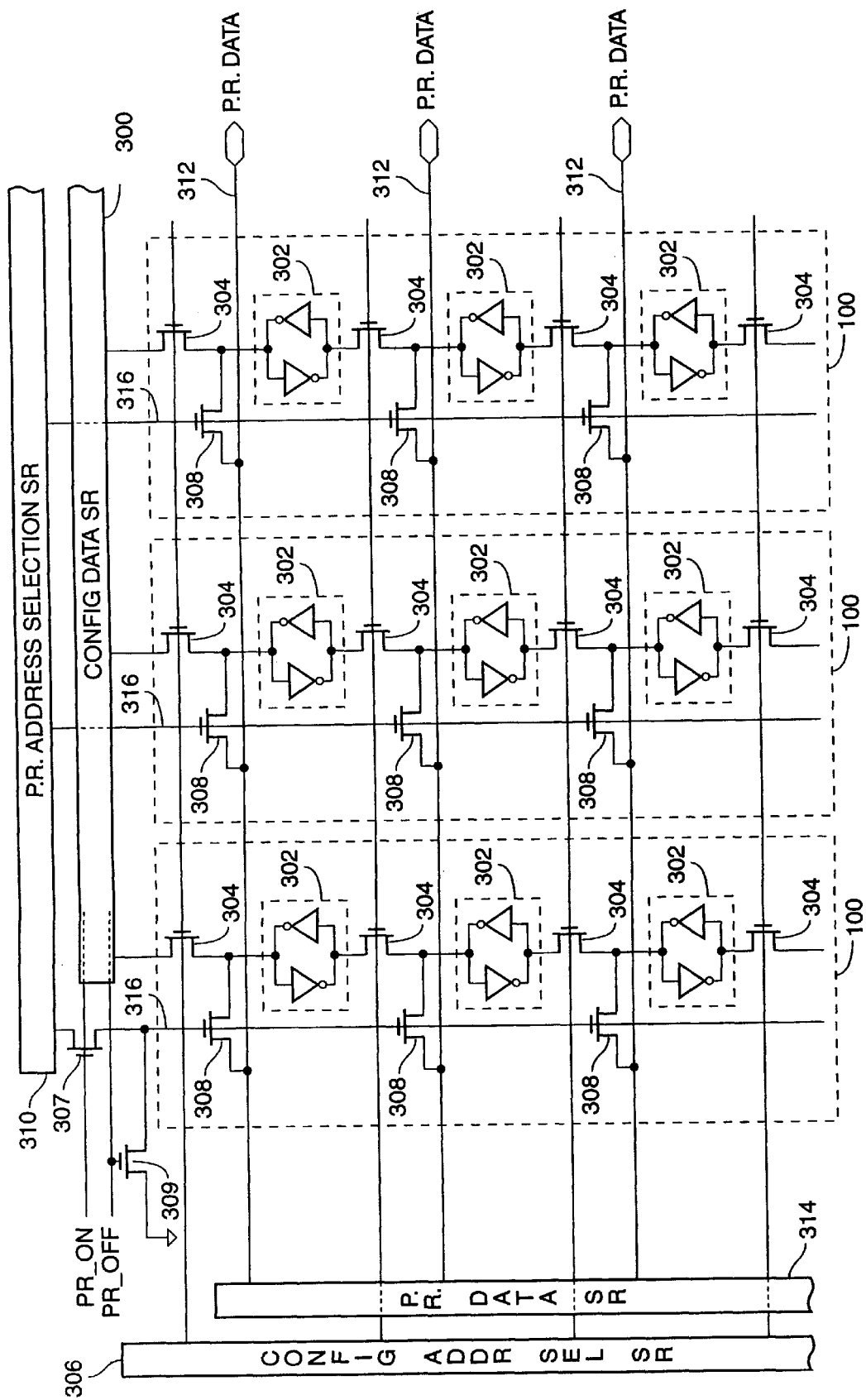
FIG. 3 shows an architecture according to one embodiment of the present invention for a dynamically partially reconfigurable PLD.

FIG. 2 is a simplified block diagram of an exemplary logic element 100. Logic element 100 includes a multi-input look-up table (LUT) 200 coupled to a configurable register 202 for implementing combinational as well as sequential logic. A memory block 204 drives the inputs of LUT 200 and stores the configuration data for the logic element. Memory block 204 typically employs static random access memory (SRAM) cells to store the configuration data. FIG. 3 illustrates memory block 204 in greater detail.

Referring to FIG. 3, an architecture according to one embodiment of the present invention for a partially reconfigurable PLD is shown. FIG. 3 depicts a portion of three SRAM blocks 204 for three adjacent logic elements in a LAB. In this embodiment, partial reconfigurability is provided for a PLD with a FIFO programming architecture. That is, during normal configuration, data from a configuration data shift register (SR) 300 is applied to and travels through a string of serially connected SRAM cells 302 until it reaches its final destination. The string of SRAM cells 302 are separated by access transistors 304 whose gate terminals are controlled by address information supplied by configuration address selection SR 306.

Partial reconfiguration or data injection is made possible by data injection transistors 308. The gate terminals of data injection transistors 308 are controlled by address information on partial reconfiguration (PR) address lines 316 supplied by PR address selection SR 310. Data injection transistors 308 connect bidirectional PR data lines 312 to inputs of respective SRAM bits as shown. A PR data SR 314 supplies the partial reconfiguration data onto the bidirectional PR data lines 312.

A pair of transistors 307 and 309 connect to each address line 316 (only one pair shown). By controlling the signals PR_ON and PR_OFF at the gate terminals of transistors 307 and 309, the user can select an address and supply data to respective address line 316 without disturbing the previous configuration. This is accomplished by asserting the PR_OFF signal while a logic "1" is shifted through PR address selection SR 310 to the desired column. This ensures that none of the intermediate memory cell columns are selected as the logic "1" is shifted through. Once it reaches the desired column, PR_OFF is turned off and PR_ON is asserted to allow reconfiguration data to be supplied to the desired PR address line 316.

The PR address lines 316 preferably span the length of a LAB column, and the bidirectional PR data lines 312 span the length of a row of LABs. This embodiment would thus require as many PR address lines 316 as there are columns of logic elements. For example, a PLD may include a 16-bit LUT 200 and five LABs 102 per column, with each LAB including, for example, eight logic elements. For such an exemplary PLD, there will be 16×5×8=640 bidirectional PR data lines 312 per column of LABs. Special layout techniques can be employed such that data lines are shared in order to reduce the number of data lines. For example, the 16 bits for one LUT can be layed out at the pitch of two adjacent logic elements such that the data lines for two logic elements are shared, reducing the number of data lines by half. Bidirectional PR data lines 312 can also be used to perform sample and load operations to observe and control the logic state of internal nodes (in this case SRAM configuration bits) as taught in the above-reference related, commonly-assigned and co-pending U.S. patent application Ser. No. 08/615,342.

In operation, by asserting a selected PR address line 316, the user is able to inject data from PR data lines 312 into a single selected column of memory blocks 204. Since the data injection resources are completely independent of the rest of the circuit, and since data injection transistors 308 are provided for each SRAM cell 302, any column of memory blocks can be randomly reconfigured in user mode (i.e., during normal operation of the PLD) without disturbing the logic functionality.

It is to be understood that the embodiment shown in FIG. 3 provides an illustrative architecture, and that the data injection circuitry can be varied in alternative architectures. For example, 16 SRAM cells 302 for a 16 bit LUT can be laid out vertically at the pitch of two vertically adjacent logic elements 100. In this example, the 16 memory bits 302 from the first column would serve for example the top logic element, while the 16 memory bits from the second column would serve the bottom logic element. This allows 16 PR data lines 312 to be shared by two vertically adjacent logic elements, reducing the number of added PR data lines 312 by half.

Figure 4:
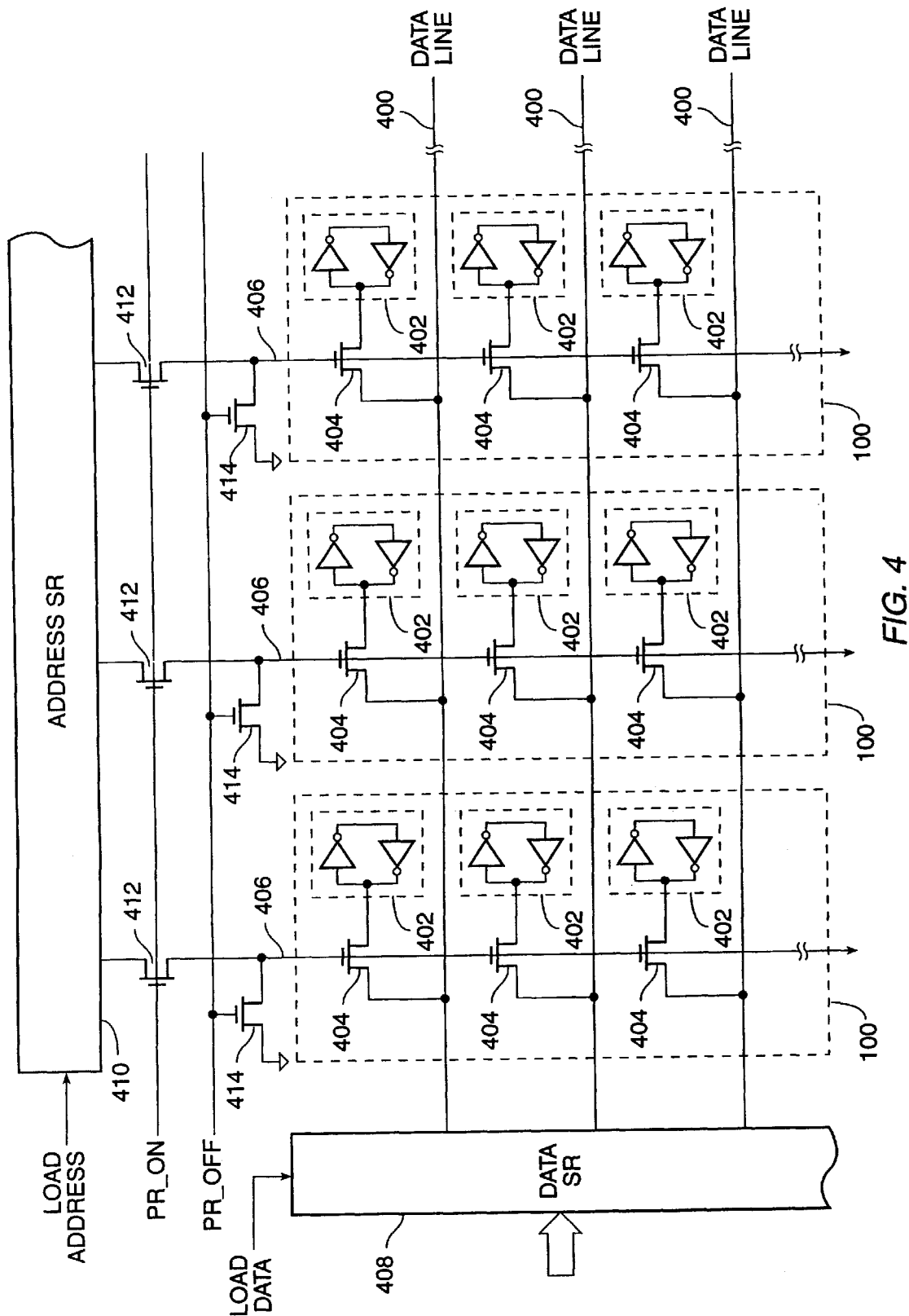
FIG. 4 shows an alternative architecture for a dynamically partially reconfigurable PLD according to another embodiment of the present invention.

FIG. 4 shows an alternative architecture for a dynamically partially reconfigurable PLD according to another embodiment of the present invention. In this embodiment, instead of a FIFO programming architecture, the PLD of the present invention provides address (or frame) wide programming. Multiple dedicated data lines 400 are provided for each row of memory cells corresponding to a row of logic elements in a LAB. In FIG. 4, three exemplary memory cells 402 from three adjacent logic elements are shown. Access transistors 404 couple configuration data on data lines 400 to memory cells 402. The gate terminals of access transistors 404 are driven by address lines 406. A data shift register (SR) 408 supplies the configuration data and an address SR 410 supplies the address information.

A pair of transistors 412 and 414 connect to each address line 406 to enable dynamic partial reconfiguration. By controlling the signals PR_ON and PR_OFF at the gate terminals of transistors 412 and 414, the user can select an address and load data into respective memory cells without disturbing the previous configuration. This is accomplished by asserting the PR_OFF signal while a logic "1" is shifted through address SR 410 to the desired column. This ensures that none of the intermediate memory cell columns are selected as the logic "1" is shifted through. Once it reaches the desired column, PR_OFF is turned off and PR_ON is asserted to allow reconfiguration data to be written into the desired column of memory cells.

The address wide accessing architecture shown in FIG. 4 thus allows for partial configuration and dynamic partial reconfiguration by the user. The same address/data SR's and data lines that are used for initial configuration are used for dynamic partial reconfiguration as well. The granularity of partial reconfiguration depends on the amount programming resources made available to the user. That is, in one extreme the circuit can be made bit-by-bit programmable and reconfigurable if dedicated data lines are provided per bit. More coarse reconfigurability would result in the case where data lines are shared by larger groups of memory cells. Address wide or frame wide reconfigurability is a practical compromise in terms of complexity of the circuit and flexibility to the user.

Thus, the present invention offers the circuitry and methodology to provide the user with a PLD that is dynamically partially reconfigurable. The configuration of a PLD can be changed in whole or in part without halting the operation nor losing any of the logic state of the PLD. The circuitry allows loading a subset of the PLD configuration data into a data holding register inside the PLD, and specifying the address of the configuration data to be modified. The modification are made crisply, i.e., while the system is still running in full speed and without intermediate configurations being inserted between initial and destination configurations. When the PLDs according to the present invention are used in prototyping or emulation systems, dynamic partial reconfigurability allows the user to crisply inject faults to more effectively debug and troubleshoot the emulated design.

While the above provides a complete description of various embodiments of the present invention, it is possible to use various alternatives, modifications and equivalents. For example, in the frame wide addressing embodiment, instead of one address and data register, a pair of registers can be provided one on each side of a rectangular array serving the respective half the of configuration bits in the array. For example, in FIG. 4, a second data SR 408 and a second address SR 410 can be placed on the opposite sides of the array and coupled to their respective half side of the array. Such an arrangement almost doubles the rate of programming and reconfiguration process. Therefore, the scope of this invention should be determined not with reference to the above description, but should instead be determined by reference to the appended claims along with their full scope of equivalents.

What is claimed is:

1. A programmable logic device (PLD) comprising:
   a plurality of logic elements coupled together by an interconnect network, each one of said plurality of logic elements including a plurality of memory cells for storing configuration data, said plurality of memory cells forming a serial chain coupled together via access transistors;
   a configuration data line coupled to said serial chain of memory cells, data being transferred from memory cell to memory cell in said chain via said access transistors;
   a plurality of partial reconfiguration (PR) data lines corresponding to said plurality of memory cells; and
   a plurality of data injection transistors respectively coupling said plurality of memory cells to said corresponding plurality of PR data lines.

2. The programmable logic device of claim 1 wherein said plurality of logic elements are arranged in an array of columns and rows, said PLD further comprising:
   a plurality of configuration data lines respectively coupled to memory cells within said columns of logic elements;
   a configuration data register driving said plurality of configuration data lines;
   a plurality of configuration address lines respectively coupled to said plurality of access transistors; and
   a configuration address selection register driving said plurality of configuration address lines.

3. The programmable logic device of claim 2 further comprising:
   a partial reconfiguration (PR) data register driving said plurality of PR data lines, said PR data register storing data to be supplied onto said plurality of PR data lines;
   a plurality of partial reconfiguration (PR) address lines respectively coupled to a control terminal of said plurality of data injection transistors per column; and
   a partial reconfiguration (PR) address selection register driving said plurality of PR address lines.

4. A programmable logic device comprising:
   a plurality of logic elements arranged in an array of columns and rows, each logic element having a plurality of memory cells respectively coupled to a corresponding plurality of access transistors, said plurality of memory cells for storing configuration data;
   a plurality of address lines each one driving control terminals of a plurality of access transistors in a column of memory cells inside a column of logic elements;
   an address register coupled to and driving said plurality of address lines;
   a plurality of data lines each one coupled to one row of access transistors inside a row of logic elements; and
   a data register coupled to and driving said plurality of data lines.

5. The programmable logic device of claim 4 further comprising a plurality of pass gates, each one coupling between one of said plurality of address lines and said address register, gate terminals of said plurality of pass gates being coupled to a first partial reconfiguration control signal.

6. The programmable logic device of claim 5 further comprising a plurality of deselecting transistors each one coupling between one of said plurality of address lines and a reference voltage, gate terminals of said plurality of deselecting transistors being coupled to a second partial reconfiguration control signal.

7. In a programmable logic device (PLD) having a first-in first-out programming mechanism, a method for partially reconfiguring the PLD without halting the operation of the PLD in the user mode, the method comprising the steps of:
   A. providing a plurality of partial reconfiguration data lines respectively coupled to a plurality of memory cells via data injection transistors;
   B. loading a subset of the PLD reconfiguration data into a partial reconfiguration data holding register;
   C. loading reconfiguration address information into a partial reconfiguration address holding register;
   D. selectively activating said data injection transistors in response to said reconfiguration address information; and
   E. writing said subset of the PLD reconfiguration data into selected memory cells.

* * * * *

UNITED STATES PATENT AND TRADEMARK OFFICE
CERTIFICATE OF CORRECTION

PATENT NO. : 6,020,758
DATED : February 1, 2000
INVENTOR(S) : Patel et al

It is certified that error appears in the above-identified patent and that said Letters Patent is hereby corrected as shown below:

On the title page: Item [56]

| | | | |
|---|---|---|---|
| 4,700,187 | 10/13/87 | Furtek | 340/825 |
| 4,845,633 | 07/04/89 | Furtek | 364/490 |
| 4,918,440 | 04/17/90 | Furtek | 340/825 |
| 5,019,736 | 05/28/91 | Furtek | 307/465 |
| 5,243,238 | 09/07/93 | Kean | 307/465 |

Signed and Sealed this

Twentieth Day of February, 2001

Attest:

NICHOLAS P. GODICI

Attesting Officer

Acting Director of the United States Patent and Trademark Office